United States Patent [19]

Stone

[11] 3,713,137

[45] Jan. 23, 1973

[54] DIGITAL TO ANALOG CONVERTER

[75] Inventor: David W. Stone, Franklin, Wis.

[73] Assignee: Harnischfeger Corporation, Milwaukee, Wis.

[22] Filed: Nov. 23, 1970

[21] Appl. No.: 91,826

[52] U.S. Cl. ................340/347 DA, 328/27, 318/603

[51] Int. Cl. ..............................................H03k 13/02

[58] Field of Search ................328/27, 140, 155, 186; 318/138, 603; 235/92 CC; 340/347 DA, 347 SY

[56] References Cited

UNITED STATES PATENTS

| | | | |
|---|---|---|---|
| 2,537,427 | 1/1951 | Seid et al ........................... | 328/27 |
| 3,277,464 | 10/1966 | Naydan et al.................. | 340/347 DA |
| 3,571,685 | 3/1971 | Akins et al. .......................... | 318/603 |
| 3,641,566 | 2/1972 | Konrap et al. ................. | 340/347 DA |

*Primary Examiner*—Thomas A. Robinson
*Attorney*—James E. Nilles

[57] ABSTRACT

A digital-to-analog converter converts a digital pulse train into a sine analog voltage and a cosine analog voltage whose frequency is proportional to the pulse repetition rate. A binary digital counter receiving the pulses counts up and down between zero and a preselected upper limit count in response to up and to down input signals respectively. A first analog signal generator generates one voltage step of one quadrant of a staircase sine voltage wave for each discrete count stored in the counter, and a second analog signal generator derives one voltage step of one quadrant of a staircase cosine voltage wave for each discrete count stored in the counter. Up/down circuit means operable after the counter has counted backwards to zero count applies the up signal to the counter and is also operable after the counter has proceeded forward to the upper limit count to apply the down signal to the counter. Means operable each time the counter counts backward to zero reverse the polarity of the voltage steps of the staircase sine wave to form the positive and negative half cycles of the sine w ave, and means operable each time the counter proceeds to the upper limit count reverse the polarity of the voltage steps of the staircase cosine wave to form the positive and negative half cycles of the cosine wave.

50 Claims, 3 Drawing Figures

INVENTOR:
DAVID W. STONE
BY: James E. Nilles
ATTORNEY

INVENTOR:
DAVID W. STONE

BY: James E. Nilles

ATTORNEY

DIGITAL TO ANALOG CONVERTER

BACKGROUND OF THE INVENTION

Inputs and outputs from industrial systems are often either electrical analog signals which change continuously with time or digital signals which change in sudden discontinuous jumps, or pulses. The intelligence in a digital signal may reside in such characteristics as pulse width and pulse frequency, and digital logic circuits utilizing signal characteristics defined in amplitude by classification into one of two static values, 0 or 1, inherently provide a high degree of accuracy. The intelligence in an analog signal which changes continuously with time resides in the signal magnitude, and although analog circuits are inherently less accurate than digital circuits, analog circuits have found widespread use for industrial controls because of the ease of converting physical phenomena such as speed and pressure into analog signals. Industrial controls often embody both digital and analog circuits to obtain the inherent advantages of both types of systems and require converters for changing digital signals to analog signals, and vice versa.

SUMMARY OF THE INVENTION

The digital-to-analog converter of the invention has a digital binary counter which counts input pulses thereto in a forward direction between a lower limit count, preferably zero and an upper limit count of $n$ when an "up" input signal is applied thereto and counts down when a "down" input signal is applied thereto. First generating means coupled to the counter derive one voltage step of one quadrant of a staircase sine voltage wave for each discrete count stored in the counter, and second generating means coupled to the counter derive one voltage step of one quadrant of a staircase cosine voltage wave for each discrete count stored in the counter. First and second sensing means respectively detect when the counter is at zero and when it stores the upper limit count. Up/down circuit means is operated by the first sensing means to apply the "up" input signal to the counter so that it will count up from zero and is also operated by the second sensing means to apply the "down" input signal to the counter so that it will count down. Blocking means temporarily prevent change of the count stored in the counter while the up and down signals are being changed. First holding means are responsive to both the output from the first sensing means and the trailing edge of the $n^{th}$ input pulse which counted the counter down to zero to apply a clear input signal to the counter to hold the count at zero during changing of quadrants, and second holding means are operated in response to both the output from the second sensing means and the trailing edge of the $n^{th}$ pulse which counted the counter up to the upper limit count to apply a preset input signal to the counter to hold it at the upper limit count during changing of the quadrants. Quadrant control means is indexed in response to both an operation of the first holding means and the $n$ plus 1 pulse to couple the voltage steps of the sine staircase wave to the inverting input of a first operational amplifier and in response to both the succeeding operation of the first holding means and to the $n$ plus 1 input pulse to couple the voltage steps to the non-inverting input to thereby form successive half cycles of opposite polarity of the sine wave. The quadrant control means also is indexed in response to both an operation of the second holding means and to the $n$ plus 1 pulse to couple the voltage steps of the staircase cosine voltage wave to the inverting input of a second operational amplifier and in response to the succeeding operation of the second holding means and to the $n$ plus 1 pulse to couple the voltage steps to the non-inverting input to thereby form successive half cycles of opposite polarity of the cosine staircase wave.

Therefore, it is an object of the invention to provide an improved digital-to-analog converter for converting a digital pulse train into a sine analog voltage and a cosine analog voltage displaced 90° from the sine voltage whose frequency is a function of the pulse repetition rate. Another object of the invention is to provide such a converter wherein the magnitude and frequency of the analog output voltages are selectively variable and the sequence in which the quadrants of the sine and cosine output signals are generated is also selectively variable. A further object is to provide such a digital-to-analog converter which permits instantaneous reversal of the sequence in which the quadrants are generated and instantaneous inversion of the sign of the output signals and is particularly adapted to control electric motors.

A still further object is to provide such a digital-to-analog converter which permits manual or automatic selection of magnitude, frequency, and sequence of quadrants of the sine and cosine output signals.

A further object of the invention is to provide such a digital-to-analog converter utilizing integrated circuit storage, transfer, and memory elements.

These and other objects and advantages of the present invention will appear hereinafter as this disclosure progresses, reference being had to the accompanying drawings.

DESCRIPTION OF THE PREFERRED EMBODIMENT

THEORY OF OPERATION

Figure 1:
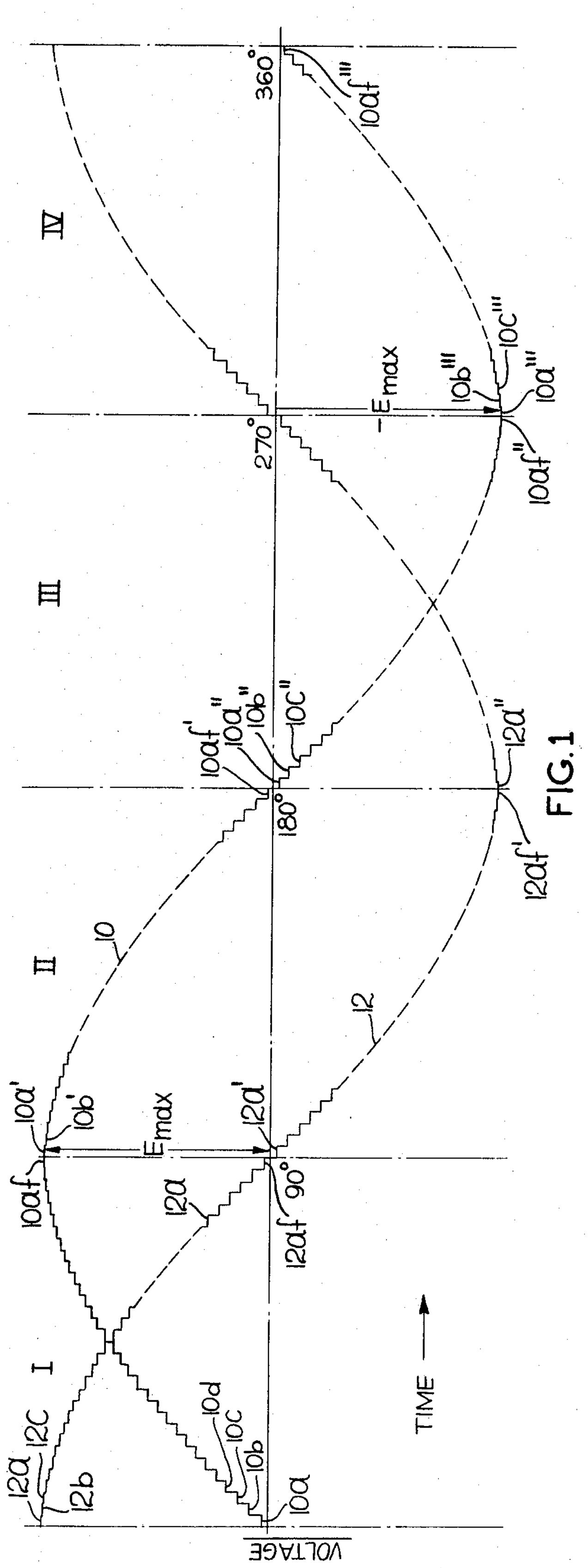
FIG. 1 illustrates the sine and cosine voltage analog output signals from a preferred embodiment of the invention.

Referring to FIG. 1 of the drawing, one cycle of the sine analog output voltage 10 from the digital-to-analog converter of the invention has 31 incremental voltage steps forming 32 voltage levels **10*a*, 10*b*, 10*c* . . . 10 *af* in the first quadrant I plotted as ordinates versus time as abscissa which progressively increase from the smallest voltage level 10*a* at 0° to the maximum voltage level 10*af* having the magnitude $^{E}$max at 90°; 31 decremental voltage steps forming 32 voltage levels 10*a'*, 10*b'*, 10*c'* . . . 10*af'* which progressively decrease in the second quadrant II from the maximum voltage level 10*a'* having the magnitude $^{E}$max at 90° to the minimum voltage level 10*af'* at 180° to complete the positive half cycle of the sine output voltage 10; 32 incremental voltage levels 10*a''*, 10*b''*, 10*c''* . . . 10*af''*** which progressively increase in the negative direction in the third quadrant III from the smallest voltage level 10a'' at 180° to the maximum voltage level 10af'' having the magnitude $-^{E}$max at 270°; and thirty-one voltage steps forming 32 voltage levels 10a''', 10b''', 10c''' . . . 10af''' which progressively decrease in the fourth quadrant IV from the maximum level 10a''' having the magnitude $-^{E}$max at 270° to the minimum level 10af''' at 360° to complete the negative half cycle of sine voltage analog output signal 10. The width of each voltage level such as 10a through 10af is slightly less than three electrical degrees, and the voltage steps define a staircase voltage which approximates a sinusoidal wave, particularly when applied to an inductive load.

FIG. 1 also represents the cosine analog output voltage 12 generated by the digital-to-analog converter which lags sine voltage 10 by 90° and similarly comprises 32 voltage levels in each quadrant such as the 32 voltages 12a through 12af which progressively decrease in the first quadrant I from level 12a having the magnitude $^{E}$max at 0° to the minimum level 12af at 90° to define a portion of the positive half cycle of the cosine output signal 12.

GENERAL DESCRIPTION

Figure 2:
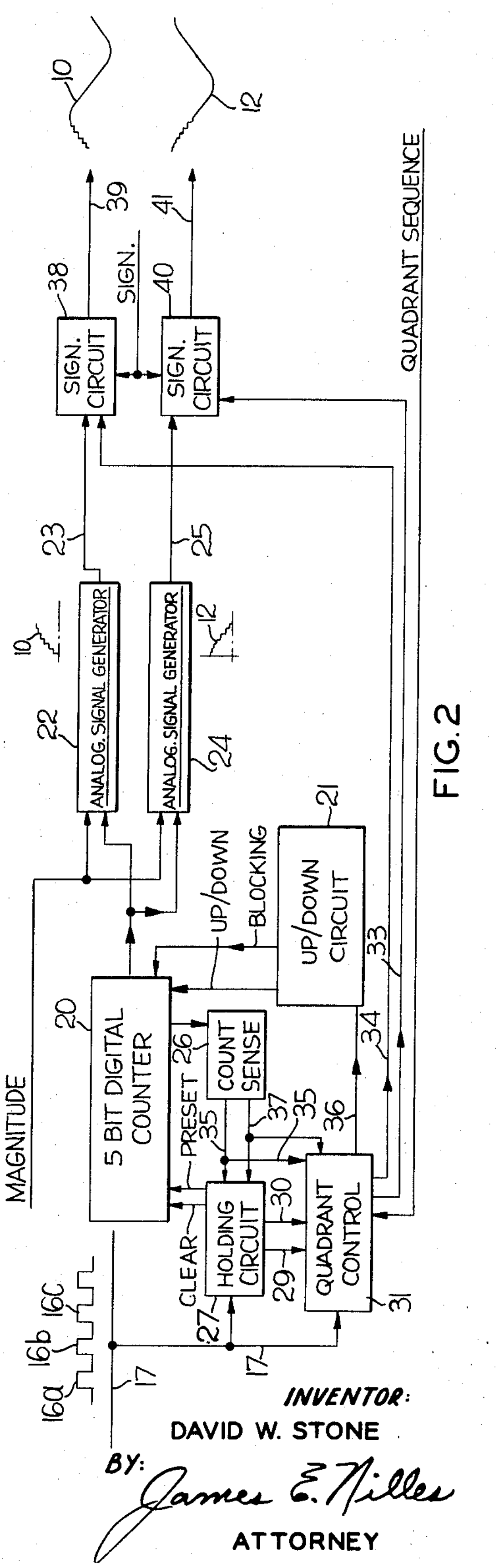
FIG. 2 is a schematic representation of a preferred embodiment of the invention in block form.

The digital to analog converter shown in block form in FIG. 2 generates one quadrant I, II, III, or IV of the sine output analog voltage 10, and one quadrant of the cosine output voltage 12, for every 32 input pulses 16a through 16af of the pulse train appearing in conductor 17. When the pulse rate is high, a quadrant of 31 incremental steps will be generated in a relatively short period of time, and consequently the frequency of the sine output analog voltage 10 and of the cosine output analog voltage 12 will be high.

The train of pulses 16 appearing in conductor 17 is an input to a digital binary counter 20 which preferably is a five-bit counter capable of assuming 32 states. A logic 1 or a logic 0 voltage on an UP/DOWN bus from an up/down circuit 21 determines whether counter 20 will count forward or backwards respectively, i.e., whether each input pulse 16 will increase by one the count stored in counter 20, or will decrease the stored count by one.

An analog signal generator 22 is responsive to the count stored in counter 20 and generates a different one of the analog voltage levels 10a through 10af in a conductor 23 for each stored count. Analog signal generator 22 derives one quadrant of the sine voltage 10 for each 32 pulses 16 received by counter 20. If the count stored in counter 20 is zero, the signal in conductor 23 from analog signal generator 22 will be the minimum voltage level 10a. When the first pulse 16a is stored in counter 20, analog signal generator 22 will derive voltage 10b which will appear in conductor 23. When the second pulse 16b is stored in counter 20, analog signal generator 22 will generate voltage level 10c of the sine analog signal 10 in conductor 23. When counter 20 has counted up to 31, analog signal generator 22 will derive voltage 10af, which is equal to $^{E}$max in conductor 23. The 32nd pulse 16 indexes a quadrant control circuit 31, while counter 20 is held at 31, to change the signal on a lead 33 to a SIGN circuit 40 from logic 1 to 0 to cause the sine signal 10 to be negative in quadrant II as described hereinafter, and analog signal generator 22 is responsive to the count of 31 stored in counter 20 and generates the voltage 10a' of quadrant II in conductor 23. (which is identical in value to voltage 10af of quadrant I).

When counter 20 has counted backward to 30 upon receipt of the thirty-third pulse 16, analog signal generator 22 is responsive to such count of 30 and generates the voltage 10b' of quadrant II in conductor 23.

An analog signal generator 24 operates in a similar, but complementary manner to generate each quadrant of the cosine analog output voltage 12 in a conductor 25. When the count in digital counter 20 is zero, the output analog signal from analog signal generator 24 in conductor 25 is the voltage step 12a in quadrant I having the magnitude $E_{max}$. When the first pulse 16a is received by binary counter 20, analog signal generator 24 may provide the voltage step 12b in conductor 25. When the second pulse 16b is received and digital counter 20 stores a count of two, analog signal generator 24 will provide a voltage level 12c in conductor 25.

Analog signal generators 22 and 24 also receive an input signal from a MAGNITUDE control bus and vary the magnitude of the voltage steps such as 10a, 10b, 12a, 12b, etc. in accordance with the signal on the MAGNITUDE control bus.

A count sense gating circuit 26 senses when 31 pulses are stored in counter 20 and provides logic 0 voltage on a conductor 37. Count sense circuit 26 also detects when counter 20 has proceeded backward to zero count and provides logic 0 voltage on a conductor 35.

The logic 0 on conductor 37 is an input to a quadrant control circuit 31 which is responsive thereto to provide a logic 1 signal on an output lead 36 to an up/down circuit 21. The logic 0 on conductor 35 is also an input to quadrant control circuit 31 which is responsive thereto to provide logic 0 on output lead 36 to up/down circuit 21.

Up/down circuit 21 is responsive to logic 1 voltage on lead 36 to: (1) apply logic 1 voltage on a BLOCKING bus input to counter 20 for the purpose of preventing change of the count stored in counter 20 when changing from counting up to counting down, i.e., changing between quadrants I and II and between quadrants III and IV; (2) change the signal on the UP/DOWN bus from logic 1 to logic 0 to cause counter 20 to count backwards; and (3) subsequently change the signal on the BLOCKING bus from logic 1 to logic 0 to permit counter 20 to proceed to count. Up/down circuit 21 is responsive to logic 0 voltage on lead 36 from the quadrant control circuit 31 when counter 20 has proceeded backwards to zero count to: (1) apply logic 1 on the BLOCKING bus to prevent change of the count in counter 20 when changing between quadrants II and III and between quadrants IV and I; (2) change the signal on the UP/DOWN bus from logic 0 to logic 1 to cause the counter 20 to count forward; and (3) reapply logic 0 to the BLOCKING bus to permit counter 20 to proceed to count.

A holding circuit 27 is responsive to logic 0 on lead 37 from count sense circuit 26 when counter 20 has proceeded forward to 31 (and to the trailing edge of the thirty-first pulse 16) to provide logic 0 voltage on a PRESET bus input to counter 20 to prevent change of the stored count when quadrant control circuit 31 is indexed to change between quadrants I and II and between quadrants III and IV. Holding circuit 27 is also responsive to logic 0 on lead 35 from count sense circuit 26 when counter 20 has proceeded backward to zero count (and to the trailing edge of the thirty-first pulse) to provide logic 0 voltage on a CLEAR bus input to counter 20 to retain the count in counter 20 at zero when quadrant control circuit 31 is indexed to change between quadrants II and III and between quadrants IV and I.

When counter 20 has counted forward to 31, holding circuit 27 is responsive to the logic 0 signal on lead 37 from count sense circuit 26 (and to the trailing edge of the thirty-first pulse) to apply logic 1 voltage on an output lead 29 to quadrant control circuit 31. When counter 20 has counted down to zero, holding circuit 27 is responsive to the logic 0 on lead 35 from count sense circuit 26 (and to the trailing edge of the thirty-first pulse) to apply logic 1 on an output lead 30 to quadrant control circuit 31.

Logic 1 on lead 29 and the leading edge of the thirty-second pulse 16 on lead 17 indexes quadrant control circuit 31 to change between quadrants I and II and between quadrants III and IV by alternately providing logic 1 and logic 0 on an output lead 33 to a SIGN circuit 40 each time counter 20 has proceeded forward to a count of 31. Logic 1 on lead 33 operates SIGN circuit 40 to cause the voltage levels **12*a'* – 12*af* and 12*a''* – 12*af'* on the cosine output voltage appearing in conductor 41 to be negative in quadrants II and III (assuming logic 1 on the SIGN bus), and logic 0 on lead 33 operates SIGN circuit 40 to cause the voltage levels 12*a'''* – 12*af''* and 12*a* – 12*af* of the cosine output voltage appearing in conductor 41** to be positive in quadrants IV and I.

Logic 1 on lead 30 from holding circuit 27 and the leading edge of the thirty-second pulse 16 indexes quadrant control circuit 31 to change between quadrants II and III and between quadrants IV and I to alternately provide logic 1 and logic 0 on an output lead 34 to a SIGN circuit 38 each time counter 20 has counted backward to zero. Logic 1 on lead 34 operates SIGN circuit 38 to cause the voltage levels **10*a''* –10*af'* and 10*a'''* – 10*af''* of the sine output voltage appearing in conductor 39 to be negative in quadrants III and IV, and logic 0 on lead 34 operates SIGN circuit 38 to cause the voltage levels 10*a* – 10*af* and 10*a'* – 10*af* of the sine output voltage 10 appearing in lead 39** to be positive in quadrants I and II.

As described hereinbefore, quadrant control circuit 31 is responsive to logic 0 inputs on leads 35 and 37 from gate sense circuit 26 on the leading edge of the thirty-first pulse to provide logic 0 and logic 1 respectively on lead 36 to operate up/down circuit 21 and quadrant control circuit 31 is indexed by each logic 1 on leads 29 and 30 from holding circuit 27 and the leading edge of the thirty-second pulse to maintain the same signal on lead 36 to up/down circuit 21 when the logic 0 signal disappears from lead 35 or 37 at the leading edge of the thirty-third pulse when counter 20 proceeds to count.

Sign circuit 38 permits the signals from analog signal generator 22 in conductor 23 to appear on output conductor 39 in quadrants I and II to provide the positive half cycle of the sine analog voltage 10 and is responsive to an input signal on conductor 34 from quadrant control circuit 31 to invert the step voltages from analog signal generator 22 in quadrant III and IV to thus derive the voltage levels such as **10*a''*, 10*b''*, 10*a'''*10*b'''*, etc, which form the negative half cycle of sine output voltage 10. Similarly sign circuit 40 permits the voltage levels such as 12*a* through 12*af* from analog signal generator 24 in conductor 24 to appear in output conductor 41 in quadrants I and IV and is responsive to an input signal on conductor 33 from quadrant control circuit 31 to invert the voltages in quadrants II and III to thus derive the negative half cycle of the cosine output voltage 12**.

A signal selectively provided on a SIGN control bus input to sign circuits 38 and 40 inverts the input signals on conductors 34 and 33 from quadrant control circuit 31 and thus reverses the polarity of the sine analog voltage 10 in conductor 39 and of the cosine analog voltage 12 on conductor 41. Change of signal on the SIGN bus has the effect of multiplying sine voltage 10 and cosine voltage 12 by minus one.

A signal selectively provided on a QUADRANT SEQUENCE control bus input to quadrant control circuit changes the sequence in which the quadrants are generated and changes the signal on lead 36 from quadrant control circuit 31 between logic 0 and logic 1 so that up/down circuit 21, in turn, changes the signal on the UP/DOWN bus between logic 1 and logic 0 to reverse the direction of counting by counter 20.

DIGITAL COUNTER

Figure 3:
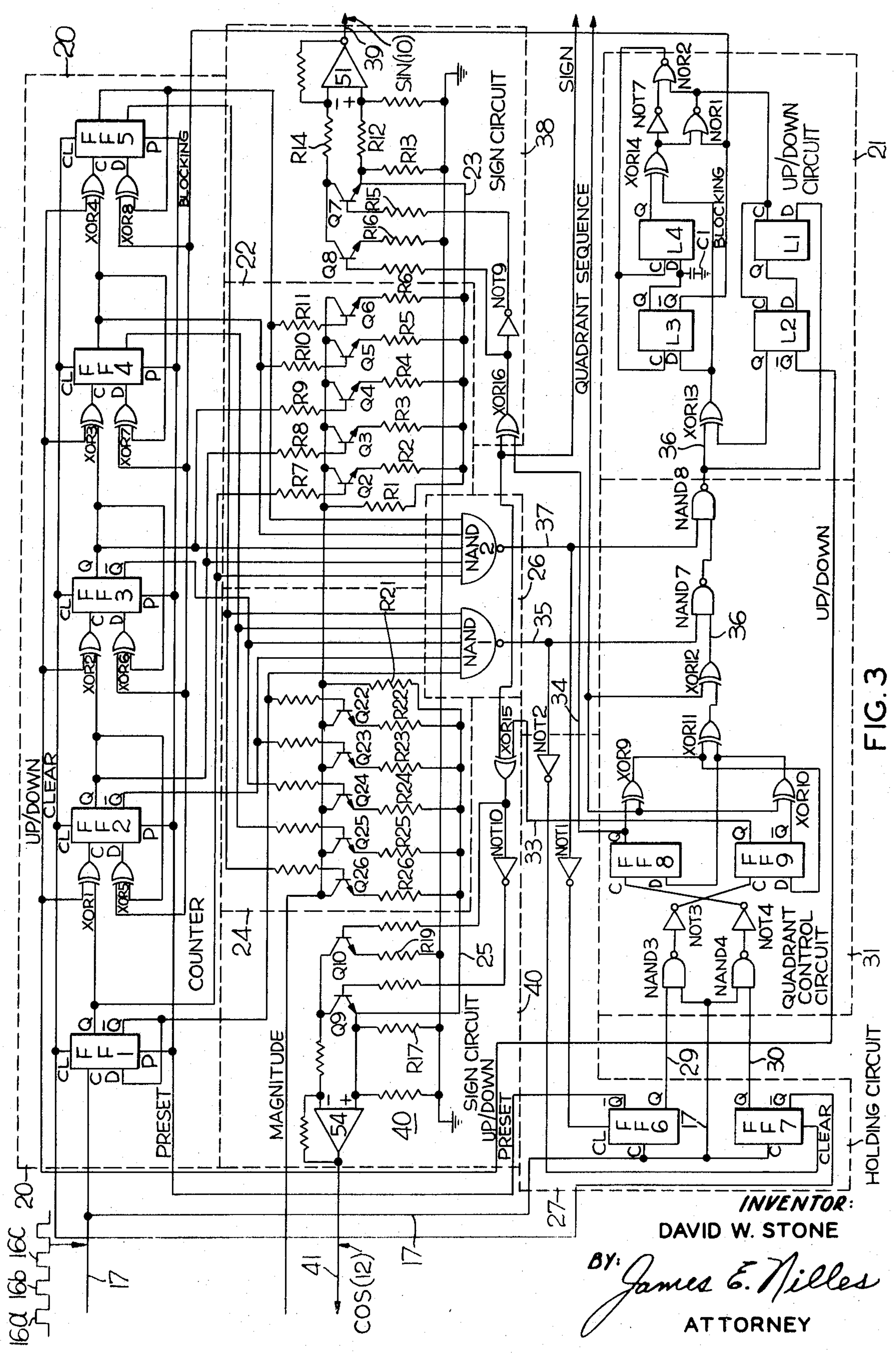
FIG. 3 is a schematic circuit diagram of the preferred embodiment.

As shown in FIG. 3, digital counter 20 may be a five-bit binary counter having five flip-flops FF1, FF2, FF3, FF4, and FF5 which preferably are D-type, leading edge triggered flip-flops such as sold by the Texas Instrument Company of Dallas, Texas under the designation SN7474. Digital counter 20 is capable of assuming 32 states and, when counting forward, proceeds from 00000 to 11111 in the 1–2–4–8–16 binary code. Each flip-flop is represented as a box having CLOCK (C), DATA (D), CLEAR (CL), and PRESET (P) input and complementary Q and Q output terminals. For purposes of description, the input and output signals in the digital-to-analog converter of the invention will be designated logic 1 (equivalent to the high voltage H) and logic 0 (equivalent to the low voltage L).

Input information on the D input is transferred to the Q output of a flip-flop FF1 through FF5 on the positive edge of the CLOCK pulse, and after the clock input threshold voltage has been passed, data on the D input is locked out. The PRESET input of each flip-flop FF1 through FF5 is coupled to a PRESET bus, and logic 0 on the PRESET bus sets the Q output of all five flip-flops FF1 through FF5 to logic 1. Logic 1 is maintained on the PRESET bus by holding circuit 27 when counter 20 is counting up or down as described hereinafter.

The CLEAR input of all five flip-flops FF1 through FF5 is coupled to a CLEAR bus, and logic 0 on the CLEAR bus sets the Q output of all five flip-flops FF1 through FF5 to logic 0 (and the Q outputs to logic 1). Logic 1 is maintained on the CLEAR bus by holding circuit 27 when counter 20 is counting up or down as described hereinafter.

The Q output of each flip-flop FF1 through FF5 is coupled to the CLOCK input of the succeeding flip-flop through an exclusive OR gate which has its A input coupled to the UP/DOWN bus, its B input coupled to the Q output of the preceding flip-flop, and its Y output coupled to the CLOCK input of the succeeding flip-flop. For example, the Q output of flip-flop FF1 is coupled to the B input of an exclusive OR gate XOR1 having its A input coupled to the UP/DOWN bus and its Y output coupled to the CLOCK input of flip-flop FF2. Similarly, the Q output of flip-flop FF2 is coupled to the B input of an exclusive OR gate XOR2 having its A input coupled to the UP/DOWN bus and its Y output coupled to the CLOCK input of flip-flop FF3. An exclusive OR gate provides logic 1 on its Y output if one and only one input A or B is 1.

Conductor 17 in which the incoming pulses 16 appear is connected to the CLOCK input of flip-flop FF1, and the Q output of flip-flop FF1 is connected to the D input thereto. The D inputs of flip-flops FF2, FF3, FF4 and FF5 are connected to the Y outputs of exclusive OR gates XOR5, XOR6, XOR7 and XOR8 respectively. The A input of each of these exclusive OR gates is connected to the BLOCKING bus and its B input is coupled to the Q output of the corresponding flip-flop. For example, the Q output of flip-flop FF2 is coupled to the B input of exclusive OR gate XOR5, the Q output of flip-flop FF3 is coupled to the B input of exclusive OR gate XOR6, etc. Logic 1 is provided on the BLOCKING bus by up/down circuit 21 when counter 20 is counting up or down, and logic 0 is provided on the BLOCKING bus when counter 20 has counted up to 31 (and also when it has counted down to zero or when the signal on the quadrant sequence bus is changed) to momentarily interrupt, or block, the operation of digital counter 20 to assure proper switching between counting up and counting down as described hereinafter.

Logic 1 on the UP/DOWN bus causes counter 20 to count forward, or up, and logic 0 on the UP/DOWN bus causes counter 20 to count backwards, or down. With logic 1 on the UP/DOWN bus, and thus on the A input of exclusive OR gate XOR1, logic 1 is supplied from the Y output of gate XOR1 each time the Q output of flip-flop FF1 goes from logic 1 to logic 0, thereby causing flip-flop FF2 to change state and the counter 20 to proceed forward. With logic 0 on the UP/DOWN bus, and thus on the A input of exclusive OR gate XOR1, logic 1 is supplied from the Y output of gate XOR1 each time the Q output of flip-flop FF1 goes from logic 0 to logic 1, thereby causing flip-flop FF2 to change states and the counter 20 to proceed backwards.

Assume the initial condition before any impulses 16 have been received. Logic 0 on the CLEAR bus has set the Q outputs of all flip-flops FF1 through FF5 to logic 0. Holding circuit 27 described hereinafter has provided logic 1 on the CLEAR bus and logic 1 on the PRESET bus, and up/down circuit 21 has provided logic 1 on the UP/DOWN bus. The logic 1 on the UP/DOWN bus results in logic 1 on the Y output of exclusive OR gates XOR1 through XOR4, and thus on the CLOCK inputs of flip-flops FF2 through FF5. The CLOCK input to each flip-flop transfers to its Q output the data on its D input, but since the D input (coupled to its Q output) of each flip-flop FF2 through FF5 is logic 0, the flip-flops FF2 through FF5 do not change states.

Up/Down circuit 21 provides logic 1 on the BLOCKING bus, thereby providing logic 1 on the A input of exclusive OR gates XOR5 through XOR8, and causing them to provide logic 1 on their Y outputs and the D inputs of flip-flops FF2 through FF5. However, the flip-flops do not change states at this time since they are of the leading edge-triggered type and transfer data on the D input to the Q output on the positive edge of the clock pulse.

When the leading edge of the first pulse **16*a* on conductor 17** is applied to the CLOCK input of flip-flop FF1, the logic 1 on its D input (which is coupled to its Q output) is transferred to the Q output and provides logic 0 on its Q output. The logic 1 on the Q output of flip-flop FF1 causes exclusive OR gate XOR1 to changes its Y output from logic 1 to logic 0. Although this logic 1-to-0 transition is coupled to the CLOCK input of flip-flop FF2, this flip-flop does not change states since it does not respond to the trailing edge of a pulse.

When the second pulse **16*b* is applied to the CLOCK input of flip-flop FF1, the logic 0 on the Q output (and thus on its D input) is transferred to its Q output. The resulting logic 0 on the B input of exclusive OR gate XOR1 provides logic 1 on its Y output which is coupled to the CLOCK input of flip-flop FF2, thereby causing flip-flop FF2 to change states and provide logic 1 on its Q output and indicating that two pulses have been received by counter 20. The condition of the flip-flops after receipt of the second pulse 6*b*** may be represented as 01000, or as shown in the following truth table:

| Flip-Flop | Q | Q |
|---|---|---|
| FF1 | 0 | 1 |
| FF2 | 1 | 0 |
| FF3 | 0 | 1 |
| FF4 | 0 | 1 |
| FF5 | 0 | 1 |

When the third pulse **16*c* is applied to the CLOCK input of flip-flop FF1, this flip-flop transfers the logic 1 on the D input thereof to its Q output. The logic 1 on the Q output of FF1 and the B input of exclusive OR gate XOR1 removes the logic 1 from the Y output of gate XOR1 which is coupled to the CLOCK input of flip-flop FF2, but this logic 1-to-0 transition has no effect on flip-flop FF2 since it does not respond to logic 1-to-0 transitions. The condition of the flip-flops after receipt of the third pulse 16*c*** may be represented as 11000, or as shown in the following truth table:

| Flip-Flop | Q | Q |
|---|---|---|
| FF1 | 1 | 0 |
| FF2 | 1 | 0 |
| FF3 | 0 | 1 |
| FF4 | 0 | 1 |
| FF5 | 0 | 1 |

The fourth pulse applied to the CLOCK input of flip-flop FF1 causes it to transfer the logic 0 on its D input (and Q output) to its Q output, thereby applying logic 0 to the B input of exclusive OR gate XOR1 and providing logic 1 on its Y output which is coupled to the CLOCK input of flip-flop FF2 and transfers the logic 0 on its D input to its Q output. The logic 0 on the Q output of flip-flop FF2 is coupled to the B input of exclusive OR gate XOR 2, hereby providing logic 1 on its Y output which is applied to the CLOCK input of flip-flop FF3 and transfers the logic 1 on its D input (from the Y output of exclusive OR gate XOR6 which has logic 1 on its A input from the BLOCKING bus) to the Q output of flip-flop FF3. The states of the flip-flops after receipt of the fourth pulse **16*d*** may be represented as 00100, or as shown in the following truth table:

| Flip-Flop | Q | Q |
|---|---|---|
| FF1 | 0 | 1 |
| FF2 | 0 | 1 |
| FF3 | 1 | 0 |
| FF4 | 0 | 1 |
| FF5 | 0 | 1 |

This manner of operation continues as additional pulses **16*e*, 16*f*, 16*g*, through 16*ae*** are received, and the state of the flip-flops FF1 through FF5 after each pulse is shown in the following truth table wherein the Q output represents the state of the flip-flop:

| Pulse | FF1 | FF2 | FF3 | FF4 | FF5 |
|---|---|---|---|---|---|
| 0 | 0 | 0 | 0 | 0 | |
| 1 | 1 | 0 | 0 | 0 | 0 |
| 2 | 0 | 1 | 0 | 0 | 0 |
| 3 | 1 | 1 | 0 | 0 | 0 |
| 4 | 0 | 0 | 1 | 0 | 0 |
| 5 | 1 | 0 | 1 | 0 | 0 |
| 6 | 0 | 1 | 1 | 0 | 0 |
| 7 | 1 | 1 | 1 | 0 | 0 |
| 8 | 0 | 0 | 0 | 1 | 0 |
| 9 | 1 | 0 | 0 | 1 | 0 |
| 10 | 0 | 1 | 0 | 1 | 0 |
| 11 | 1 | 1 | 0 | 1 | 0 |
| 12 | 0 | 0 | 1 | 1 | 0 |
| 13 | 1 | 0 | 1 | 1 | 0 |
| 14 | 0 | 1 | 1 | 1 | 0 |
| 15 | 1 | 1 | 1 | 1 | 0 |
| 16 | 0 | 0 | 0 | 0 | 1 |
| 17 | 1 | 0 | 0 | 0 | 1 |
| 18 | 0 | 1 | 0 | 0 | 1 |
| 19 | 1 | 1 | 0 | 0 | 1 |
| 20 | 0 | 0 | 1 | 0 | 1 |
| 21 | 1 | 0 | 1 | 0 | 1 |
| 22 | 0 | 1 | 1 | 0 | 1 |
| 23 | 1 | 1 | 1 | 0 | 1 |
| 24 | 0 | 0 | 0 | 1 | 1 |
| 25 | 1 | 0 | 0 | 1 | 1 |
| 26 | 0 | 1 | 0 | 1 | 1 |
| 27 | 1 | 1 | 0 | 1 | 1 |
| 28 | 0 | 0 | 1 | 1 | 1 |
| 29 | 1 | 0 | 1 | 1 | 1 |
| 30 | 0 | 1 | 1 | 1 | 1 |
| 31 | 1 | 1 | 1 | 1 | 1 |

When 31 pulses have been stored in counter 20, up/down circuit 21 provides logic 0 in the BLOCKING bus in a manner described hereinafter and subsequently provides logic 0 on the UP/DOWN bus. The logic 0 on the BLOCKING bus (and the consequent logic 1 on the output of exclusive OR gates XOR5 through XOR 8), does not change the state of flip-flops FF2 through FF5 since they transfer data on the positive edge of the CLOCK pulses. The zero on the UP/DOWN bus, and the consequent logic 1 on the Y output of exclusive OR gates XOR1 through XOR4, does not change the state of flip-flops FF2 through FF5 because the Q outputs already agree with the D inputs. Up/down circuit 21 re-applies logic 1 to the BLOCKING bus after a time delay as hereinafter described, thereby causing exclusive OR gates XOR5 through XOR 8 to provide logic 0 on their Y output, but flip-flops FF2 through FF5 do not change states since they only respond to the positive edge of the CLOCK pulse inputs. Counter 20 is now ready to count backwards, or down. As the next pulse 16 is applied to the CLOCK input of flip-flop FF1, it transfers the logic 0 on its Q output (and D input) to the Q output. The flip-flops FF1 through FF5 are now in the 01111 state.

The logic 0 on the Q output of flip-flop FF1 causes exclusive OR gate XOR 1 to change its Y output from logic 1 to logic 0, but this does not affect flip-flop FF2 which responds only to logic 0-to-1 transitions. The second pulse 16 applied to the CLOCK input of flip-flop FF1 causes it to transfer the logic 1 on its Q output (and D input) to its Q output. The logic 1 on the Q output of flip-flop FF1 causes exclusive OR gate XOR 1 to provide logic 1 on its Y output (since logic 0 is on the UP/DOWN bus), and the logic 0-to-1 transition is coupled to the CLOCK input of flip-flop FF2, causing it to transfer the logic 0 on its D input (from the Y output of exclusive OR gate XOR 5 which has logic 1 on its A and B inputs from the BLOCKING bus and Q output of flip-flop FF2) to its Q output. The state of the flip-flops FF1 through FF5 may then be represented as 10111.

The third pulse 16 to the CLOCK input of flip-flop FF1 causes it to transfer the logic 0 on its D input to its Q output. The logic 0 on the Q output of flip-flop FF1 causes exclusive OR gate XOR 1 to provide logic 0 on its Y output, but this does not affect flip-flop FF2 which responds only the logic 0-to-1 transitions. The state of flip-flops FF1 through FF5 after the third pulse may be represented as 00111. This manner of subtractive counting continues as each pulse 16 is received until counter 20 counts back to zero, at which time the condition of flip-flops FF1 through FF5 may be represented as 00000.

ANALOG SIGNAL GENERATORS

In the embodiment shown in FIG. 3, the Q outputs of flip-flops FF1 through FF5 are coupled to analog signal generator 22, and the Q outputs of flip-flops FF1 through FF5 are coupled to analog signal generator 24. Analog signal generator 22 includes a plurality of resistors R1, R2, R3, R4, R5 and R6 which are connected in different individual and parallel arrangements in response to the Q outputs of flip-flops FF1 through FF5 to generate the different levels **10*a* through 10*af* of sine analog output voltage 10. Resistor R1 is connected directly between the MAGNITUDE control bus and a conductor 23 which commons one end of resistors R1 – R6 and determines minimum voltage leverl 10*a*. Resistors R2, R3, R4, R5 and R6 are connected in series with the emitter collector circuits of transistors Q2, Q3, Q4, Q5 and Q6 respectively between the MAGNITUDE control bus and conductor 23. The bases of transistors Q2, Q3, Q4, Q5 and Q6 are connected through biasing resistors R7, R8, R9, R10, and R11** to the Q outputs of flip-flops FF1, FF2, FF3, FF4 and FF5 respectively.

Common conductor 23 is connected to the emitter of a transistor Q7, it is connected through a resistor R12 to the non-inverting input of an operational amplifier 51, and it is also connected through a resistor R13 to ground. The output from operational amplifier 51 is the output sine voltage 10 on conductor 39. The collector of transistor Q7 is connected to the inverting input of operational amplifier 51 through a resistor R14, and the base of transistor Q7 is connected through a resistor R15 to the output of an inverting amplifier NOT gate NOT9.

Resistors R1, R2, R3, R4, R5, R6 and R13 are selected so that the different magnitudes of current flowing through resistor R13 vary substantially sinusoidally as counter 20 stores the pulses **16*a*** through 16*ae*. The different voltage drops across resistor R13 are amplified by operational amplifier 51 to provide the voltage levels 10*a* through 10*af*. In a preferred embodiment the resistors may have the following values:

R1 — 32,000 ohms
R2 — 16,000 ohms
R3 — 8,000 ohms
R4 — 4,000 ohms
R5 — 2,000 ohms
R6 — 1,000 ohms
R13 — 910 ohms Assume that two volts are applied to the MAGNITUDE control bus. When the count stored in counter 20 is zero, the transistors Q2 through Q6 are cut off, and 2/32,910 equals 0.061 milliamperes flows through resistors R1 and R13 in series and develops 0.055 volts across resistor R13. When the first pulse 16*a* is stored by counter 20, logic 1 voltage on the Q output of flip-flop FF1 is applied to the base of transistor Q2, thereby turning it on and causing current to flow from the MAGNITUDE control bus through the series arrangement of the collector-emitter circuit of transistor Q2 and resistor R2 in parallel with resistor R1 and in series with resistor R13 to ground. The equivalent resistance of resistors R1 and R2 in parallel is 10,667 ohms and that of such paralleled resistors in series with R13 is 11,567 ohms, thereby resulting in a current of 2/11,567 equal 0.176 milliampheres flowing through resistor R13 and developing a potential of 0.157 volts which is applied through resistor R12 to the non-inverting input of operational amplifier 51 and generates voltage step 10*b* in conductor 39.

When the second pulse 16*b* is received, logic 0 at the Q output of flip-flop FF1 and logic 1 at the Q output of flip-flop FF2 turns transistor Q2 off and transistor Q3 on and thus permits current to flow from the MAGNITUDE control bus through the parallel arrangement of R1 and the 8000 ohm resistor R3 in series with 910 ohm resistor R13 to ground. A current of two volts/7310 ohms equals 0.0274 milliamperes thus flows through resistor R13 and generates a potential of 0.249 volts thereacross which results in a higher amplitude voltage step 10*c* in conductor 39 from the output of operational amplifier 51.

When the third pulse 16*c* is applied to counter 20, logic 1 appears at the Q outputs of flip-flops FF1 and FF2 which turns transistors Q2 and Q3 on to connect resistors R1, R2 and R3 in parallel between the MAGNITUDE control bus and common lead 23. The equivalent resistance of R1, R2 and R3 in parallel is 4571 ohms, and the equivalent resistance of these paralleled resistors in series with resistor R13 is 5481 ohms, thereby resulting in a current flow of 2/5481 equals 0.365 milliampheres through resistor R13 and causes operational amplifier 51 to generate increased voltage level 10*d* in conductor 39.

This manner of operation continues, and the equivalent resistance of the paralleled resistors R1 through R6 (and the equivalent resistance of these paralleled resistors in series with resistor R13) decreases with the receipt of each pulse 16 as shown in the following partial table:

| Pulse | Equivalent R of R1–R6 | μA through R13 | mV across R13 |
|---|---|---|---|
| 0 | 32,000 | 60.77 | 55.30 |
| 1 | 10,667 | 172.8 | 157.2 |
| 2 | 6,000 | 273.6 | 249 |
| 3 | 4,571 | 364.9 | 332 |
| 4 | 3,555 | 447.9 | 407.6 |
| 5 | 2,909 | 523.7 | 476.6 |
| 6 | 2,461 | 593.3 | 539.9 |
| 7 | 2,133 | 657.2 | 598.1 |
| 8 | 1,882 | 716.3 | 651.9 |
| 9 | 1,684 | 771 | 701.6 |
| 10 | 1,523 | 822 | 748 |
| 11 | 1,391 | 869.2 | 791 |
| 12 | 1,280 | 913 | 831.1 |

The effect of each successive pulse is to connect 16,000 additional ohms in parallel with resistor R1. The decrease in equivalent resistance results in a corresponding increase in current flow through resistor R13, a corresponding increase in voltage drop across resistor R13, and a corresponding increase in the voltage level output from operational amplifier 51. It will be appreciated that the resistance of series resistor R13 becomes relatively larger as the equivalent resistance of paralleled resistors R1 through R6 decreases so that the slope of the sine voltage curve 10 generated by the sine voltage levels 10*a* through 10*af* progressively decreases and the output from analog signal generator 22 approximates a sinoid.

Analog signal generator 24 is identical to analog signal generator 22 with the exception that the bases of the transistors Q22, Q23, Q24, Q25 and Q26 that connect resistors R21, R 22, R23, R24, R25 and R26 in different parallel arrangements are coupled to the Q outputs of flip-flops FF1, FF2, FF3, FF4 and FF5 respectively. Consequently, when a low count is stored in digital counter 20, a relatively high voltage such as cosine voltage level 12*a* is generated by operational amplifier 54 and appears on conductor 41, and when a high count is stored in digital counter 20, a relatively low voltage output signal such as cosine voltage level 12*f* is generated in conductor 41 so that analog signal generator 24 derives cosine voltage wave 12.

It will be apparent that change of the voltage on the MAGNITUDE control bus will vary the magnitude of currents flowing through the resistors such as R1 through R6 and R13 and thus adjust the magnitude of the sine output voltage 10 and the cosine output voltage 12 as a function of the signal on the MAGNITUDE control bus.

In alternative embodiments of the invention, analog signal generators 22 and 24 may be replaced by integrated circuit means for generating voltage levels such as 10*a* – 10*af* which are sinusoidal functions of the count stored in counter 20 and may comprise a 256 bit Read-Only Memory of circuit type SN 7488 disclosed in the TTL Catalog Supplement of the Texas Instrument Company.

COUNT SENSE CIRCUIT

When count sense circuit 26 detects that 31 pulses are stored in counter 20, it provides an output signal on lead 37 which causes up/down circuit 21 to change the signal on UP/DOWN bus from logic 1 to logic 0 to cause counter 20 to proceed backwards, or down. Count sense circuit 26 includes NAND gates NAND1 and NAND2 which respectively sense when 31 pulses and when zero pulses are stored in counter 20. A NAND gate provides logic 0 on its output when all of its inputs are 1's. Gate NAND1 has five inputs individually coupled to the Q outputs of flip-flops FF1 through FF5, and gate NAND2 has five inputs individually coupled to the Q outputs of flip-flops FF1 through FF5.

When the count stored in the counter 20 is zero, logic 1 appears on the Q outputs of flip-flops FF1 through FF5 and the output of gate NAND1 will be logic 0. At all other counts stored in counter 20, the output of gate NAND1 is logic 1.

When the count stored in counter 20 is 31, logic 1 appears on the Q outputs of flip-flops FF1 through FF5, and the output of gate NAND2 is logic 0. At all other counts stored in counter 20, the output of gate NAND2 is logic 1.

HOLDING CIRCUIT

Holding circuit 27 prevents alteration of the count stored in counter 20 as a change in quadrants occurs when either zero or 31 pulses are stored in counter 20. Holding circuit 27 retains the count in digital counter 20 at 31 by providing logic 0 on the PRESET bus when changing between quadrants I and II and between quadrants III and IV also retains the count in counter 20 at zero by providing logic 0 on the CLEAR bus when changing between quadrant II and III and between quadrants IV and I.

Holding circuit 27 includes a pair of flip-flops FF6 and FF7 which preferably are of the master-slave type that are clocked to the opposite state logic on 1-to-0 transitions of the CLOCK input and may be similar to those sold by the Texas Instrument Company of Dallas, Texas under the designation SN 7473. Conductor 17 in which the pulses 16 appear is connected to the CLOCK input of both flip-flops FF6 and FF7. The Q output of flip-flop FF6 is connected to the PRESET bus, and the Q output of flip-flop FF7 is connected to the CLEAR bus. The output of gate NAND2 of the count sense circuit 26 is connected over conductor 37 through a NOT gate NOT1 inverting amplifier to the CLEAR input of flip-flop FF6. The output of gate NAND1 of count sense circuit 26 is connected over conductor 35 through a NOT gate inverting amplifier NOT2 to the CLEAR input of flip-flop FF7.

During counting the logic 1 on the outputs of gates NAND1 and NAND2 at count sense circuit 26 are converted to logic 0 by gates NOT1 and NOT2 so that logic 0 is applied to the CLEAR inputs of flip-flops FF6 and FF7, thereby returning them to the cleared state with logic 1 on their Q outputs, and thus applying logic 1 on the PRESET and CLEAR buses to prevent any clearing or presetting of flip-flops FF1 through FF5 of digital counter 20 during counting.

When the thirty-first pulse is stored in counter 20, logic 1 appears on the Q outputs of flip-flops FF1 through FF5 and gate NAND2 provides a logic 0 output which is converted to logic 1 by gate NOT1, thereby applying logic 1 to the CLEAR input of flip-flop FF6 as the leading edge of the thirty-first pulse is applied to counter 20. When the trailing edge of the thirty-first pulse 16 is applied to the CLOCK input of flip-flop FF6, it changes states and provides logic 0 on its Q output and on the PRESET bus, thereby holding flip-flops FF1 through FF5 of counter 20 in their 11111 condition and assuring that flip-flops FF1 through FF5 cannot be triggered while the quadrant control circuit is indexed. This holding action by logic 0 on the PRESET bus continues until the trailing edge of the thirty-second pulse on the CLOCK input to flip-flop FF6 triggers it to the opposite state so that logic 1 appears on the Q output and on the PRESET bus, thereby allowing flip-flops FF1 through FF5 to count down beginning on the positive edge of the thirty-third pulse.

Flip-flop FF7 is not affected during the change from counting up to counting down because the logic 1 output of gate NAND1 is converted by gate NOT2 to logic 0 on the CLEAR input of flip-flop FF7. When counter 20 has counted down to zero, the Q output of all flip-flops FF1 through FF5 becomes logic 1, the output from gate NAND1 becomes logic 0 which is converted by gate NOT2 to logic 1 at the CLEAR input to flip-flop FF7, thereby releasing it from the cleared state. The trailing edge of the thirty-first pulse is applied to the CLOCK input of flip-flop FF7 and changes its state so that logic 0 appears at its Q output and on the CLEAR bus. Logic 0 on the CLEAR bus holds flip-flops FF1 through FF5 in the cleared condition, i.e., 00000, while the digital-to-analog converter is changing between quadrants II and III and between quadrants IV and I.

QUADRANT CONTROL CIRCUIT

Quadrant control circuit 31 is responsive to the signals on input lead 29 from holding circuit 27 to alternately provide logic 0 and logic 1 on output lead 33 to SIGN circuit 40 each time counter 20 has counted up to 31 to cause analog signal generator 24 to generate positive voltage levels **12*a* through 12*af* on output conductor 41 in quadrants I and IV and to cause SIGN circuit 40 to invert the voltage levels in quadrants II and III. Quadrant control circuit 31 is responsive to the signals in input lead 30 from holding circuit 27 to alternately provide logic 0 and logic 1 on output lead 34 to SIGN circuit 38 each time counter 20 has counted backwards to zero to cause analog signal generator 22 to derive positive voltage levels 10*a* through 10*af*, and 10*a'* through 10*af'* in output conductor 39 in quadrants I and II respectively and to cause SIGN circuit 38** to invert the voltage levels in quadrants III and IV.

Quadrant control circuit 31 is responsive to logic 0 on lead 37 from gate NAND2 when counter 20 has counted up to thirty-one to provide logic 1 on lead 36 to operate up/down circuit 21 to provide logic 0 on the UP/DOWN bus, and is also responsive to logic 0 on lead 35 from gate NAND1 when counter 20 has counted down to zero to provide logic 0 on lead 36 to operate up/down circuit 21 to provide logic 1 on the UP/DOWN bus. Quadrant control circuit 31 also switches in response to input signals over leads 29 and 30 from holding circuit 27 (which signals occur subsequent to the signals on leads 35 and 37 from gates NAND1 and NAND2) so that it will maintain the same signal on lead 36 to up/down circuit 21 after the logic 0 output of gate NAND2 becomes logic 1 when counter 20 has counted down from 31 at the leading edge of the thirty-third pulse and also after the output of gate NAND1 changes from logic 0 to logic 1 after counter 20 has counted up from zero at the positive edge of the thirty-third pulse.

Quadrant control circuit 31 includes a pair of NAND gates NAND3 and NAND 4. The A input of gate NAND 3 is connected over lead 29 to the Q output of flip-flop FF6, its B input is connected to conductor 17 in which the input pulses 16 appear, and its output is connected through a NOT gate inverting amplifier NOT 3 to the CLOCK input of a leading edge triggered flip-flop FF9 which preferably is similar to flip-flops FF1 through FF5. The A input of gate NAND 4 is connected to conductor 17, its B input is connected over conductor 30 to the Q output of flip-flop FF7, and its output is coupled through a NOT gate NOT 4 to the CLOCK input of a flip-flop FF9 which is similar to flip-flop 9.

The Q output of flip-flop FF8 is connected to the A input of an exclusive OR gate XOR 9, and the Q output of flip-flop FF9 is connected to the B input of an exclusive OR gate XOR 10. The B input to exclusive OR gate XOR 9 and the A input to exclusive OR gate XOR 10 is from the quadrant sequence control bus, and logic 0 or logic 1 on the quadrant sequence bus determines the direction of counting, or sequence of quadrants generated by counter 20. The outputs of exclusive OR gates XOR 9 and XOR 10 are connected to the A and B inputs respectively of an exclusive OR gate XOR 11. The output of gate XOR 9 is fed back to the D input of flip-flop FF9, and the output of gate XOR 10 is also fed back to the D input of flip-flop FF8. The Y output of gate XOR 11 is coupled to the B input of an exclusive OR gate XOR 12 having its A input coupled to the quadrant sequence bus.

Quadrant control circuit 31 includes a NAND gate NAND 7 which on its A input receives the output from gate NAND 1 over lead 35 and on its B input receives the output from gate XOR 12. The output of gate NAND 7 is applied to the B input of a NAND gate NAND 8 whose A input is over lead 37 from the output of gate NAND 2 of the count sense circuit 26.

Assume that the following conditions exist when counter 20 is proceeding forward in quadrant I:

Q of FF8 — 0
Q of FF9 — 0
QUADRANT SEQUENCE — 1
SIGN — 1
XOR 9 — 1
XOR 10 — 0
XOR 11 — 1
XOR 12 — 0

The logic 0 at the Q output of flip-flop FF8 is supplied over lead 34 to the B input of exclusive OR gate XOR 16 of SIGN circuit 38 which has logic 1 voltage on its A input from the SIGN control bus, thereby providing logic 1 at the output of gate XOR 16 which is applied to the base of transistor Q8 and turns it on. Conduction by transistor Q8 connects the inverting input of operational amplifier 51 to ground through resistors R14 and R16 in series with the emitter-collector circuit of transistor Q8. The logic 1 on the output of gate XOR 16 is converted to logic 0 by gate NOT 9 so that transistor Q7 remains off and the voltage from analog signal generator 38 developed across resistor R13 and appearing on conductor 23 is impressed through resistor R12 on the non-inverting input of operational amplifier 51 and generates the voltage levels 10*a* through 10*af* in the positive direction in quadrant I.

Similarly the logic 0 on the Q output of flip-flop FF9 appears on conductor 33 and provides logic 1 from exclusive OR gate XOR 15 of sign circuit 40 which is applied to the base of transistor Q10 and turns it on to ground the inverting input of operational amplifier 54 of SIGN circuit 40 through resistor R19. Logic 1 from gate XOR 15 is converted by gate NOT 10 to logic 0 which is applied to the base of transistor Q9 to keep it off so the voltage steps developed across resistor R17 and appearing on lead 25 are applied to the non-inverting input of operational amplifier 54 so that the voltage steps 12*a*, 12*b*, 12*c*, are in the positive direction in quadrant I.

When counter 20 has proceeded forward to 31, logic 0 on lead 37 from gate NAND 2 at the leading edge of the thirty-first pulse changes the output from a gate NAND 8 on lead 36 to the up/down circuit 21 to logic 1. Further, flip-flop FF6 of holding circuit 27 changes states on the trailing edge of the thirty-first pulse, and logic 1 at the Q output of flip-flop FF6 (and thus on lead 29) results in logic 0 on the output of gate NAND3 when the leading edge of the thirty-second pulse is applied to its B input, thereby changing the output of gate NOT 3 to logic 1 and applying logic 1 to the CLOCK input of flip-flop FF9 and causing it to switch states and transfer the logic 1 from its D input to its Q output. The resulting logic 1 at the Q output of flip-flop FF9 is applied over lead 33 to the B input of exclusive OR gate XOR 15 of SIGN circuit 40. Still assuming logic 1 appears on the SIGN control bus which is coupled to the A input of gate XOR 15, the output of gate XOR 15 becomes logic 0 and turns off transistor Q10. The logic 0 from gate XOR 15 is converted to logic 1 by gate NOT 10 and applied to the base of transistor Q9 of SIGN circuit 40, thereby turning transistor Q9 on and connecting the voltage developed across resistor R17 of analog sine generator 24 to the inverting input of operational amplifier 54 so that the voltage steps 12*a'* through 12*af'* of cosine output voltage 12 are in the negative direction in quadrants II and III.

The change in state of flip-flop FF9 applies logic 0 to its Q output and results in the output of gate XOR 10 changing from 0 to 1 (since it was assumed to have logic 1 on its A input from the QUADRANT SEQUENCE bus). Under the assumed conditions with logic 1 on the output of gate XOR 9, the logic 1 output from gate XOR 10 changes the output of gate XOR 11 to logic 0. The output of gate XOR 11 is coupled to the B input of exclusive OR gate XOR 12 having logic 1 on its A input from the QUADRANT SEQUENCE bus, and the logic 0 output from gate XOR 11 changes the output of gate XOR 12 to logic 1.

The logic 1 on the A and B inputs of gate NAND 7 (from lead 35 and gate XOR 12) provides logic 0 to the B input of gate NAND 8 so that its B input agrees with the logic 0 on its A input over lead 37 from gate NAND 2 of the gate sense circuit 26, thereby assuring that the logic 1 signal will remain on lead 36 to the up/down circuit 21 when counter 20 counts down from 31 and the output of gate NAND 2 on lead 37 becomes logic 1. The logic 1 from gate XOR 12 to the B input of gate NAND 7 prepares quadrant control circuit 31 so that it will change the signal on lead 36 to logic 0 to operate up/down circuit 21 again when counter 20 has counted down to zero and gate NAND 1 provides logic 0 on lead 35.

As described above, when counter 20 has stored 31 counts, the outputs may change from gate NAND 2 of count sense circuit 26, gate NOT 1, flip-flop FF6 of the holding circuit 27, and gate NAND 3, gate NOT 3, flip-flop FF9 and gates XOR 10, XOR 11, and XOR 12 of the quadrant control circuit 31. Similarly when counter 20 has proceeded backward to zero count in quadrant II, the output of gate NAND 1 of the count sense circuit 26 becomes logic 0, the output of gate NOT 2 becomes logic 1, and flip-flop FF7 of the holding circuit 27 changes states at the trailing edge of the thirty-first pulse to change its Q output and the CLEAR bus to logic 0 and apply logic 1 to its Q output and lead 30. On the leading edge of the thirty-second pulse 16 applied to CLOCK input of gate NAND 4 of the quadrant control circuit 31, the output of gate NAND 4 becomes logic 0, the output of gate NOT 4 becomes logic 1, and flip-flop FF8 changes states and transfers the logic 1 on its D input (from the output of gate XOR 10) to its Q output. Logic 1 from the Q output of flip-flop FF8 is applied over lead 34 to the B input of exclusive OR gate XOR 16 of SIGN circuit 38, thereby changing its output to logic 0 (under the assumed conditions of logic 1 on the SIGN control bus) and the output of gate NOT 9 to 1, thereby turning transistor Q8 off and turning transistor Q7 of SIGN circuit 38 on and applying the voltage drop across resistor R13 of analog signal generator 22 to the inverting input to operational amplifier 51 so that the voltage steps of the sine analog voltage 10 appearing on output conductor 39 are in the negative direction in quadrants III and IV.

The logic 1 on the Q output of flip-flop FF8 changes the output of gate XOR 9 to logic 0, the output of gate XOR 11 to logic 1, and the output of gate XOR 12 to logic 0 so that the B input to gate NAND 7 agrees with the logic 0 on its A input from gate NAND 1 and the logic 0 signal over lead 36 to up/down circuit 21 is maintained when counter 20 has again proceeded forward from zero count in quadrant III and the output of gate NAND 1 becomes logic 1.

If the signal on SIGN bus is changed between logic 0 and logic 1, the outputs of gates XOR 15 and XOR 16 of SIGN circuits 38 and 40 also change and connect the voltages generated by analog signal generators 38 and 40 to the opposite input terminal of operational amplifiers 51 and 54, thereby inverting the polarity of the sine analog voltage 10 and the cosine analog voltage 12 appearing on conductors 39 and 41 respectively.

Up/Down Circuit

Up/down circuit 21 is responsive to the logic 1 and logic 0 input signals over lead 36 from quadrant control circuit 31 to: (1) temporarily apply logic 0 to the BLOCKING bus at each transition between counting up and counting down for the purpose of preventing change of the count stored in counter 20 when the signal is changed on the UP/DOWN bus; (2) change the signal on the UP/DOWN bus between logic 1 and logic 0 to change the direction of counting by counter 20; and (3) to subsequently reapply logic 1 to the BLOCKING bus to permit the counter 20 to proceed to count the pulses 16.

The output from gate NAND 8 of quadrant control circuit 31 is coupled over lead 36 to the A input of an exclusive OR gate XOR 13 and to the D (data) input of a bistable latch L1. The output of exclusive OR gate XOR 13 is coupled to the D(data) input of a bistable latch L3 and also to the B input of an exclusive XO gate XOR 14.

Bistable latches L1–L4 may be of the type sold by the Texas Instrument Company of Dallas, Texas, under the designation SN 7475. A latch is a bistable logic element for temporary storage of binary information and transfers the data on its D input to its Q output when the CLOCK input signal is high. When the CLOCK goes low in a logic 1-to-0 transition, the data that was present at the D input at the time of the transition is stored on the Q output. The Q output of latch L1 is coupled to the D input of a similar latch L2. The Q output of latch L2 is coupled to the B input of gate XOR 13.

The Q output of latch L3 is connected to the BLOCKING bus, and the Q output of latch L3 is coupled to the D input of a similar latch L4 through a time delay circuit schematically shown as a timing capacitor C1 connected between the D input of latch L4 and ground. The A input of gate XOR 14 is from the Q output of latch L4. The output of gate XOR 14 is coupled to the input of a NOT gate, NOT 7 and also to the A input of a NOR gate NOR 1. The B input to gate NOR 1 is from the BLOCKING bus. The output from gate NOT 7 is the B input to a NOR gate NOR 2. the B input to gate NOR 2 is from the output of gate NOR 1, and the output from gate NOR 2 is coupled to the CLOCK inputs of latches L3 nd L4 which constitute a timer and are latched with logic 0 on their Q outputs when counter 20 is counting up or down.

A NOR gate provides logic 1 on its output when all the inputs thereto are logic 0.

The output from gate NOR 1 is coupled to the CLOCK inputs of latches L1 and L2 which are locked with logic 0 on their Q outputs (and thus logic 1 on the UP/DOWN bus) when counter 20 is counting forward and with logic 1 on their Q outputs (and thus logic 0 on the UP/DOWN bus) when counter 20 is counting down, or backwards.

Assuming that logic 1 exists on the QUADRANT SEQUENCE control bus and that counter 20 is counting backward in quadrant II, the state of the elements may be represented as follows:

| Element | Logic State |
|---|---|
| QUADRANT SEQUENCE bus | 1 |
| BLOCKING bus | 1 |
| UP/DOWN bus | 0 |
| PRESET bus | 1 |
| Q of FF6 | 0 |
| Q of FF7 | 0 |
| NAND 3 | 1 |
| NAND 4 | 1 |
| FF8 | 0 |
| FF9 | 1 |
| XOR 9 | 1 |
| XOR 10 | 1 |
| XOR 11 | 0 |
| XOR 12 | 1 |
| NAND 1 | 1 |
| NAND 2 | 1 |
| NAND 7 | 0 |
| NAND 8 | 1 |
| XOR 13 | 0 |
| XOR 14 | 0 |
| Q of L1 | 1 |
| Q of L2 | 1 |
| Q of L3 | 0 |
| Q of L4 | 0 |
| NOR 1 | 0 |
| NOR 2 | 0 |

It will be noted that the CLOCK inputs to memory latches L1 through L4 from the outputs of gates NOR1 and NOR 2 are low so that data on their outputs is stored therein until the CLOCK inputs go high, or to logic 1.

When counter 20 has counted down to zero, flip-flops FF1 through FF5 of counter 20 assume the 00000 state with logic 1 on their Q outputs, the output of gate NAND 1 becomes logic 0, the output of gate NAND 7 becomes logic 1, and the output of gate NAND 8 becomes logic 0. The logic 0 output from gate NAND 8 is applied over lead 36 to the A input of gate XOR 13 and changes its output to logic 1. The logic 1 output from gate XOR 13 applied to the B input of gate XOR 14 changes its output to logic 1. The logic 1 output from gate XOR 14 changes the output of gate NOT 7 to logic 0 and the output of gate NOR 2 to logic 1, thereby raising the CLOCK inputs to latches L3 and L4 of the timer to high and permitting them to change states and transfer the data on their D inputs to their Q outputs. The logic 1 output from gate XOR 13 appearing on the D input of latch L3 causes it to apply logic 0 to its Q output and to the BLOCKING bus to block the operation of flip-flops FF1 through FF5 when the signal is changed on the UP/DOWN bus. The Q output of latch L3 changes to logic 1, but the time delay including capacitor C1 delays its application to the D input of latch L4.

When latch L4 changes its Q output to logic 1, the output of gate XOR 14 becomes logic 0, the output of gate NOT 7 becomes logic 1, and the output of gate NOR 2 becomes logic 0 to lower the CLOCK input to latches L3 and L4 and lock them with logic 1 on their Q outputs.

Logic 0 output from gate XOR 14 and logic 0 on the BLOCKING bus applied to the A and B inputs respectively of gate NOR 1 changes its output to logic 1, thereby raising the CLOCK inputs to latches L1 and L2 to high and permitting them to change states. Latch L1 transfers the logic 0 on its D input (from gate NAND 8) to its Q output, and the logic 0 on the Q output from latch L1 applied to the D input of latch L2 causes it to change states and provides logic 0 on its Q output and logic 1 on its Q output and thus on the UP/DOWN bus to cause the counter 20 to proceed forward.

The logic 0 from the Q output of latch L2 changes the output of gate XOR 13 to logic 0, thereby changing the output of gate XOR 14 to logic 1 and the output of gate NOT 7 to logic 0. The logic 1 on the output of gate XOR 14 applied to the A input of gate NOR 1 changes its output to loglc 0, thereby changing the CLOCK inputs to latches L1 and L2 to low and locking them with logic 0 on their Q outputs The logic 0 on the A input to gate NOR 2 from gate NOT 7 and the logic 0 on its B input from gate NOR 1 changes its output to logic 1, thereby raising the CLOCK input to latches L3 and L4 to high and permitting them to change states. The logic 0 output from gate XOR 13 applied to the D input of latch L3 is transferred to its Q output and logic 1 appears on its Q output and is thus re-applied to the BLOCKING bus to permit counter 20 to proceed to count. After a time delay provided by timing capacitor C1, the logic 0 on the Q output of latch L3 causes latch L4 to change states and provide logic 0 on its Q output and thus on the A input to gate XOR 14, thereby providing logic 0 output from gate XOR 14, logic 1 output from gate NOT 7, and logic 0 output from gate NOR 2 to change the CLOCK inputs to latches L3 and L4 to low and lock them with logic 0 voltage on their Q outputs.

Up down circuit 21 is now locked with logic 0 on the Q outputs of latches L3 and L4 and logic 0 on the Q outputs of latches L1 and L2, and thus with logic 0 on the B input of gate XOR 13 so that up/down circuit 21 will be operated again when counter 20 counts up to 31, the output of gate NAND 2 becomes logic 0 and changes the output of gate NAND 8 to logic 1 which is applied over lead 36 to the A input of gate XOR 13. Up down circuit 21 will then proceed in a similar manner to apply logic 0 to the BLOCKING bus, to change the signal on the UP/DOWN bus from logic 1 to logic 0, and subsequently reapply logic 1 to the BLOCKING bus.

If the signal on the QUADRANT SEQUENCE bus were changed from logic 1 to logic 0 under the conditions assumed above while counter 20 was counting forward in quadrant I with logic 0 on lead 36, the logic 0 applied to the A input of gate XOR 12 of quadrant control circuit 31 would change its output to logic 0, the output of gate NAND 7 to logic 1, the output of gate NAND 8 on lead 36 (and thus the A input to gate XOR 13) to logic 1 and result in a similar operation of up/down circuit 21 to temporarily apply logic 0 to the BLOCKING bus, change the signal on the UP/DOWN bus from logic 1 to logic 0 to cause counter 20 to proceed backwards, and then reapply logic 1 to the BLOCKING bus. The logic 0 so applied to the QUADRANT SEQUENCE bus would also be applied to the B input of gate XOR 9 and the A input of gate XOR 10, thereby changing both of their outputs to logic 0. Consequently, when counter 20 has proceeded backward to zero count and gate NAND 1 provides logic 0 output on lead 35, the resulting operation of flip-flop FF8 on the leading edge of the thirty-second pulse would provide logic 0 on its Q output and lead 34 to sign circuit 40 (from the output of gate XOR 10) to invert the sine analog voltage levels appearing in conductor 39. Thus changing the signal on the QUADRANT SEQUENCE bus results in altering the sequence in which the quadrants of the analog sine and cosine output voltages 10 and 12 are generated so that the time axis of these voltages would be to the left (i.e. along the −X rectangular coordinate axis) instead of the right as seen in FIG. 1.

The foregoing description has been presented only to illustrate the principles of the invention. Accordingly, it is desired that the invention not be limited to the embodiments described but rather that it be accorded an interpretation consistent with the scope and spirit of its broad principles.

I claim:

1. A digital-to-analog converter comprising, in combination, a digital binary counter adapted to count input pulses thereto in a forward direction between a predetermined lower limit and a predetermined upper count limit when an up signal is applied thereto and to count backwards between said limits when a down signal is applied thereto, means for generating one quadrant of a staircase voltage wave in which each step is a function of a discrete count stored in said counter each time said counter proceeds between said upper and lower limits, means operable after said counter is at said upper limit for applying said down signal to said counter and also operable after said counter is at said lower limit for applying said up signal to said counter, and means operable each time said counter reaches said lower limit to reverse the polarity of said voltage steps derived by said generating means to thereby form successive half cycles of opposite polarity of said staircase wave.

2. A digital-to-analog converter in accordance with claim 1 wherein said means for applying said up and down signals includes first detecting means for sensing when said counter is at said lower limit count, second detecting means for sensing when said counter is at said upper limit count, and means operable after the output of said first and said second detecting means respectively for applying said up signal and said down signal to said counter.

3. A digital-to-analog converter in accordance with claim 1 wherein said counter is set to said lower limit when a clear input signal is applied thereto, and including first detecting means for sensing when said counter is at said lower limit count, and holding means operable subsequent to the output of said first detecting means for temporarily applying said clear input signal to said counter.

4. A digital-to-analog converter in accordance with claim 3 wherein said holding means includes first flip-flop means responsive to both the output of said first detecting means and to the trailing edge of the pulse which set said counter to said lower limit count for applying said clear input signal to said counter and being responsive to the trailing edge of the succeeding input pulse to remove said clear signal.

5. A digital-to-analog converter in accordance with claim 3 wherein said means to reverse the polarity of said staircase wave voltage steps includes inverting means operable between first and second states in which said voltage steps are inverted and are not inverted respectively, and quadrant control means operable after successive outputs from said holding means to alternately operate said inverting means between said first and second states.

6. A digital-to-analog converter in accordance with Claim 4 wherein said means to reverse the polarity of said staircase wave voltage steps includes inverting means operable between first and second states in which said voltage steps are inverted and are not inverted respectively, and quadrant control means responsive to both an output from said first flip-flop means and said succeeding pulse to operate said inverting means to said first state and also being responsive to both a succeeding like output from said first flip-flop means and said succeeding pulse to operate said inverting means to said second state.

7. A digital-to-analog converter in accordance with claim 6 wherein said inverting means includes an operational amplifier having inverting and non-inverting inputs and equal minus and plus gain for signals coupled respectively thereto and switching means responsive to logic 1 and logic 0 inputs respectively to couple said voltage steps alternately to said inverting and non-inverting inputs of said amplifier, and wherein said quadrant control means includes NAND gate means for providing a logic 0 output in response to both an output from said first flip-flop means and said succeeding pulse and means including second flip-flop means responsive to successive logic 0 outputs from said NAND gate means to alternately apply said logic 0 and logic 1 signals to said switching means.

8. A digital-to-analog converter in accordance with claim 1 and including means to temporarily block change of the count stored in said counter while said up and down signals are being switched.

9. A digital-to-analog converter in accordance with claim 1 wherein the magnitude of each of said staircase wave voltage steps is approximately equal to the sine of the ratio of stored count/ upper limit count times 90° times the peak voltage of said staircase wave, and also including means for generating one quadrant of a cosine voltage staircase wave in which each step is a cosine function of each discrete count stored in said counter each time said counter proceeds between said upper and lower limits, the magnitude of each voltage step of said staircase cosine wave being approximately equal to the cosine of the ratio of stored count/ upper limit count times 90° times the peak voltage of said staircase cosine wave, and means operable after each time said counter reaches said upper limit count to reverse the polarity of said voltage steps of said cosine staircase wave to thereby form successive half cycles of opposite polarity of said cosine wave.

10. A digital-to-analog converter in accordance with claim 9 and including magnitude control means for selectively varying the magnitude of said steps of said sine and of said cosine staircase waves by the same factor.

11. A digital-to-analog converter in accordance with claim 4 and including means for selectively reversing said up and down signal applying means to remove the signal then being applied to said counter and to apply the opposite signal thereto and thereby reverse the direction of counting by said counter and the sequence in which the quadrants of said sine and cosine waves are being generated.

12. A digital-to-analog converter in accordance with claim 2 wherein said means to reverse the polarity of said voltage steps includes, means for amplifying said voltage steps of said staircase wave and being adapted to invert said voltage steps in response to an inverting input signal, and means operable after successive outputs from said first detecting means to alternately apply said inverting signal to and to remove said inverting signal from said amplifying means.

13. A digital-to-analog converter in accordance with claim 1 wherein the magnitude of each of said voltage steps is approximately equal to the sine of the ratio of stored count/upper limit count times 90° times the peak voltage of said staircase wave, said counter includes a plurality of cascaded flip-flops, and said means for generating said steps of said staircase voltage wave includes a plurality of parallel branch circuits each of which includes the series arrangement of a resistor and the emitter-collector circuit of a transistor having its base coupled to the output of one of said flip-flops of said counter and also includes a voltage drop resistor in series with said parallel branch circuits.

14. A digital-to-analog converter in accordance with claim 13 wherein said means for reversing the polarity of said staircase wave voltage steps includes an amplifier having inverting and non-inverting inputs, transistor switching means for coupling said voltage drop resistor alternately to said inverting and non-inverting inputs in response to logic 0 and logic 1 input signals, first detecting means for sensing when said counter is at said lower limit count, and quadrant control means operable after successive outputs from said first detecting means for alternately applying logic 1 and logic 0 signals to said transistor switching means.

15. A digital-to-analog converter in accordance with claim 2 wherein said counter includes a plurality of cascaded flip-flops having Q and Q outputs, said first detecting means includes a first NAND gate having its inputs individually coupled to the Q outputs of said flip-flops, and said second detecting means includes a second NAND gate having its inputs individually coupled to the Q outputs of each flip-flop.

16. A digital-to-analog converter in accordance with claim 15 wherein said means for applying said up and down signals includes first gate means for deriving logic 0 and logic 1 signals respectively in response to the logic 0 output from said first and second NAND gates, and up/down circuit means responsive to said logic 0 and logic 1 signals respectively from said first gate means for applying said up and down signals to said counter.

17. A digital-to-analog converter in accordance with claim 16 wherein said counter in prevented from changing the count stored therein when a blocking signal is applied thereto, and said up/down circuit means includes means responsive to said logic 0 signal or to said logic 1 signal from said first gate means to apply a blocking signal to said counter and to subsequently derive a delay signal after a predetermined time delay, means responsive to both said logic 0 signal from said first gate means and said delay signal to apply said up signal to said counter and also being responsive to both said logic 1 signal from said first gate means and said delay signal to apply said down signal to said counter, said blocking signal applying means being adapted to remove said blocking signal subsequent to each operation of said last-named means.

18. A digital-to-analog converter in accordance with claim 16 wherein said first gate means includes third and fourth NAND gates having one input coupled to the output of said first and second NAND gates respectively, the output of said third NAND gate being coupled to another input to said fourth NAND gate.

19. A digital-to-analog converter in accordance with claim 18 having means including gate means operable after the outputs from said first and second detecting means respectively for applying logic 0 and logic 1 signals to the other input to said third NAND gate so that the inputs to said third NAND gate agree when said counter is at said lower limit and the inputs to said fourth NAND gate agree when said counter is at said upper limit and the logic 1 or logic 0 output from said first gate means remains the same after said counter has counted away from either of said limits.

20. A digital-to-analog converter in accordance with claim 19 and including means for selectively reversing the signal on said other input of said third NAND gate between logic 1 and logic 0 to thereby change the output of said first gate means between logic 1 and logic 0 and thus effect a change in the direction of counting by said counter.

21. A digital-to-analog converter in accordance with claim 9 wherein said counter is set to said lower and upper limit counts when clear and preset signals respectively are applied thereto, and said converter includes, first and second detecting means for sensing when said counter is at said lower and upper limits respectively, and first and second holding means operable subsequent to the outputs of said first and second detecting means respectively for temporarily applying said clear and preset signals to said counter.

22. A digital-to-analog converter in accordance with claim 21 wherein said first holding means includes first flip-flop means responsive to both the output of said first detecting means and the trailing edge of the pulse which set said counter to said lower limit for applying said clear signal to said counter and being responsive to the trailing edge of the succeeding pulse to remove said clear signal, and said second holding means includes second flip-flop means responsive to both the output of said second detecting means and the trailing edge of the pulse which set said counter to said upper limit for applying said preset signal to said counter and being responsive to the trailing edge of the succeeding pulse to remove said preset signal.

23. A digital-to-analog converter in accordance with claim 22 wherein said means to reverse the polarity of said staircase sine wave voltage steps includes first inverting means operable between first and second states in which said voltage steps are inverted and are not inverted respectively and first switching means responsive to logic 1 and logic 0 input signals to operate said first inverting means between said first and second states alternately, said means to reverse the polarity of said cosine staircase wave voltage steps includes second inverting means operable between first and second states in which said voltage steps are inverted and are not inverted respectively and second switching means responsive to logic 1 and logic 0 input signals to operate said second inverting means between said first and second states alternately, and quadrant control means for applying logic 1 and logic 0 input signals to said first and second switching means and being indexed after each operation of said first holding means to reverse the input signals to said first switching means and also being indexed after each operation of said second holding means to reverse the input signals to said second switching means.

24. A digital-to-analog converter in accordance with claim 23 and including means for selectively reversing the input signals to said first and second switching means to thereby invert the voltage steps of said sine and cosine staircase waves.

25. A digital-to-analog converter in accordance with claim 23 wherein said quadrant control means is indexed to reverse said input signals to said first switching means between logic 1 and logic 0 in response to both each output of said first holding means and a succeeding input pulse to said counter and is indexed to reverse said input signals to said second switching means between logic 1 and logic 0 in response to both each output of said second holding means and a succeeding input pulse to said counter.

26. A digital-to-analog converter in accordance with claim 25 wherein said quadrant control means includes fifth and sixth NAND gates each of which receives the input pulses to said counter on one input thereof, a second input of said fifth NAND gate being coupled to an output of said first holding means, and a second input of said sixth NAND gate being coupled to an output of said second holding means.

27. A digital-to-analog converter in accordance with claim 26 wherein said quadrant control means includes third and fourth flip-flops having Q outputs on which said logic input signals to said first and second switching means respectively are generated, said third and fourth flip-flops having data inputs and being adapted upon receipt of a triggering pulse to transfer the information on said data input to said Q output, means responsive to logic 0 outputs from said fifth and sixth NAND gates respectively for applying triggering signals to said third and fourth flip-flops, and means for supplying logic 1 and logic 0 signals alternately to said data inputs of said third and of said fourth flip-flops to reverse the logic input signal on the data input of the other flip-flop.

28. A digital-to-analog converter in accordance with claim 27 wherein said fourth flip-flop has Q and Q outputs, said means to reverse the logic signal on said data inputs includes first and second exclusive OR gates each of which has an input connected to a quadrant sequence control bus, a second input of said first exclusive OR gate being coupled to the Q output of said third flip-flop and the output of said first exclusive OR gate being coupled to the data input of said fourth flip-flop, a second input of said second exclusive OR gate being coupled to the Q output of said fourth flip-flop and the output of said second exclusive OR gate being coupled to the data input of said third flip-flop, whereby selective reversal of the signal on said quadrant sequence control bus reverses the sequence in which the quadrants of said sine and cosine staircase waves are generated.

29. A digital-to-analog converter comprising, in combination, digital binary counter means for counting input pulses thereto in a forward direction between a predetermined lower limit and a predetermined upper limit count when an up signal is applied thereto and for counting backwards between said limits when a down signal is applied thereto, means for generating one quadrant of a sine voltage staircase wave in which each step is a sine function of a discrete count stored in said counter means each time said counter means proceeds between said upper and lower limits, means for generating one quadrant of a cosine voltage staircase wave on which each step is a cosine function of discrete count stored in said counter means each time said counter means proceeds between said upper and lower limits, first detecting means for sensing when said counter means is at said lower limit, second detecting means for sensing when said counter means stores said upper limit count, means operable after each output from said first detecting means to apply said up signal to said counter means and operable after each output from said second detecting means to apply said down signal to said counter means, means operable after each output from said first detecting means for reversing the polarity of said voltage steps of said sine staircase wave to thereby form successive half cycles of opposite polarity of said sine staircase wave, and means operable after each output from said second detecting means for reversing the polarity of said voltage steps of said cosine staircase wave to thereby form successive half cycles of opposite polarity of said cosine staircase wave.

30. A digital-to-analog converter in accordance with claim 29 and including magnitude control means for selectively varying the magnitude of said voltage steps of said sine and cosine staircase waves by the same factor.

31. A digital-to-analog converter in accordance with claim 29 wherein said means for reversing the polarity of said sine wave voltage steps include first inverting means for said voltage steps operable between first and second states in which said voltage steps are inverted and are not inverted respectively and first switching means for alternately operating said first inverting means between said first and second states in response to logic 0 and logic 1 input signals, said means for reversing the polarity of said cosine wave voltage steps include second inverting means for said voltage steps operable between first and second states in which said voltage steps are inverted and are not inverted respectively and second switching means for alternately operating said second inverting means between said first and second states in response to logic 0 and logic 1 input signals, and wherein said converter includes quadrant control means for applying logic 1 and logic 0 input signals to said first switching means alternately after successive outputs from said first detecting means and for applying logic 1 and logic 0 input signals alternately to said second switching means after successive outputs from said second detecting means.

32. A digital-to-analog converter in accordance with claim 31 wherein said counter means is adapted to store said lower and upper limit counts respectively when clear and preset signals are applied thereto, and wherein said converter includes first holding means operable after each output from said first detecting means for applying said clear signal to said counter means, and second holding means operable after each output from said second detecting means for applying said preset signal to said counter means.

33. A digital-to-analog converter in accordance with claim 32 wherein said first holding means is responsive to both the output from said first detecting means and the trailing edge of the input pulse which set said counter means at said lower limit count and said second holding means is responsive to both the output from said second detecting means and the trailing edge of the pulse which switched said counter means to said upper limit count.

34. A digital-to-analog converter in accordance with claim 33 wherein said quadrant control means is responsive to both each output from said first holding means and a succeeding input pulse to reverse said logic 1 and logic 0 input signals to said first switching means and is also responsive to both each output from said second holding means and a succeeding input pulse to reverse said logic 1 and logic 0 input signals to said second switching means.

35. A digital-to-analog converter in accordance with claim 34 wherein said first holding means is responsive to the trailing edge of said succeeding pulse to remove said clear signal, and said second holding means is responsive to the trailing edge of said succeeding pulse to remove said preset signal.

36. A digital-to-analog converter in accordance with claim 35 wherein said quadrant control means includes first and second NAND gates each of which receives said input pulses on one input thereof, a second input of said first NAND gate being coupled to an output of said first holding means and a second input of said second NAND gate being coupled to an output of said second holding means.

37. A digital-to-analog converter in accordance with claim 36 wherein said quadrant control means includes first and second flip-flop means having Q outputs on which said logic input signals to said first and second switching means respectively are derived, said first and second flip-flop means having data inputs and being adapted upon receipt of a triggering signal to transfer the information on said data input to said Q output, means responsive to logic 0 outputs from said first and second NAND gates respectively for applying triggering signals to said first and second flip-flop means, and means for supplying logic 1 and logic 0 signals alternately to said data inputs of said first and second flip-flop means and being responsive to the reversal of the output of either of said flip-flop means to reverse the logic input signal on said data input of said other flip-flop means.

38. A digital-to-analog converter in accordance with claim 37 wherein said second flip-flop means has Q and Q outputs, said means to reverse the signal on said data input of said first and second flip-flop means includes first and second exclusive OR gates each of which has an input connected to a quadrant sequence control bus, a second input of said second exclusive OR gate being coupled to the Q output of said second flip-flop means and the output of said second exclusive OR gate being coupled to the data input of said first flip-flop means, a second input of said first exclusive OR gate being coupled to the Q output of said first flip-flop means and the output of said first exclusive OR gate being coupled to the data input of said second flip-flop means.

39. A digital-to-analog converter in accordance with claim 38 wherein said counter means has a plurality of cascaded flip-flops having Q and Q outputs, said first detecting means includes a third NAND gate having inputs coupled individually to the Q outputs of said flip-flops of said counter means and said second detecting means includes a fourth NAND gate having inputs individually coupled to the Q outputs of said flip-flops of said counter means.

40. A digital-to-analog converter in accordance with claim 38 wherein said up and down signal applying means includes fifth and sixth NAND gates having one input respectively coupled to the output of said third and fourth NAND gates, the output of said fifth NAND gate being coupled to a second input of said sixth NAND gate, a third exclusive OR gate having inputs connected to the outputs of said first and second exclusive OR gates, and a fourth exclusive OR gate having a first input coupled to said quadrant sequence control bus and a second input coupled to the output of said third exclusive OR gate and its output coupled to another input of said fifth NAND gate.

41. A digital-to-analog converter in accordance with claim 39 wherein said up and down signal applying means includes NAND gate means coupled to the outputs of said third and fourth NAND gates for providing logic 0 and logic 1 signals respectively in response to logic 0 outputs from said third and fourth NAND gates.

42. A digital-to-analog converter in accordance with claim 41 wherein said counter means includes gate means for blocking change of the count stored in said counter when a blocking signal is applied thereto, and said up and down signal applying means includes means responsive to said logic 1 or said logic 0 output from said NAND gate means to apply a blocking signal to said counter and to subsequently provide a delay signal after a preselected time interval, means responsive to both said logic 1 output from said NAND gate means and said delay signal to apply said down signal to said counter and also being responsive to both said logic 0 output from said NAND gate means and said delay signal to apply said up signal to said counter, and means for removing said blocking signal after application of said up signal or said down signal to said counter by said last-named means.

43. A digital-to-analog converter in accordance with claim 40 wherein said up and down signal applying means includes fifth and sixth NAND gates having one input coupled respectively to the output of said third and fourth NAND gates, the output of said fifth NAND gate being coupled to a second input to said sixth NAND gate, and gate means responsive to each output of said first flip-flop means of said quadrant control means for applying a logic 0 signal to a second input to said fifth NAND gate so that the inputs thereto agree and also being responsive to each output of said second flip-flop means of said quadrant control means for applying a logic 1 signal to said second input of said fifth NAND gate so that the inputs to said sixth NAND gate agree and said up and down signal applying means do not switch when said counter proceeds away from said lower or said upper limit count.

44. A digital-to-analog converter in accordance with claim 31 wherein said counter means has a plurality of cascaded flip-flops having Q and Q outputs and said means for generating said staircase sine voltage wave includes a plurality of parallel branches each of which includes the series arrangement of a resistor and the emitter-collector circuit of a transistor having its base coupled to the Q output of one of said flip-flops and a first voltage drop resistor in series with said parallel branches, and said means for generating said staircase wave cosine voltage includes a plurality of parallel branches each of which includes the series arrangement of a resistor and the emitter-collector circuit of a transistor having its base coupled to the Q output of one of said flip-flops and a second voltage drop resistor in series with said parallel branches.

45. A digital-to-analog converter in accordance with claim 44 wherein said first inverting means includes a first operational amplifier having inverting and non-inverting inputs and equal minus and plus gain for signals coupled respectively thereto and said first switching means couples said first voltage drop resistor alternately to said inverting and non-inverting inputs of said first amplifier and said second inverting means includes a second operational amplifier having inverting and non-inverting and equal minus and plus gain for signals coupled respectively thereto and said second switching means couples said second voltage drop resistor alternately to said inverting and non-inverting inputs of said second amplifier.

46. A digital-to-analog converter in accordance with claim 41 wherein said counter means includes gate means for preventing change of the count stored therein when a blocking signal is applied thereto, said up and down signal applying means includes first bistable latch means operable to first and second conditions respectively to apply said blocking signal to and to remove it from said counter means, and means including a fifth exclusive OR gate responsive to the change of the output signal from said NAND gate means to either logic 1 or logic 0 for switching said first bistable latch means to said first condition to apply said blocking signal to said counter means.

47. A digital-to-analog converter in accordance with claim 46 wherein said up and down signal applying means also includes second bistable latch means having an input coupled to the output of said NAND gate means, a clock input, and a first output of which said up and down signals are generated and being adapted to change states and reverse the signals on said first output in response to both changes of said logic 1 and logic 0 signals from said NAND gate means and a triggering signal on said clock input, and means responsive to switching of said first bistable latch means to said first condition to apply a triggering signal to said clock input of said second bistable latch means after a predetermined time delay.

48. A digital-to-analog converter in accordance with claim 47 wherein said second bistable latch means has a second output coupled to an input of said fifth exclusive OR gate, and said means for switching said first bistable latch means is responsive to the reversal of the output of said fifth exclusive OR gate to switch said first bistable latch means to said second condition and thereby remove said blocking signal after change of states of said second bistable latch means to reverse said up and down signals.

49. A digital-to-analog converter in accordance with claim 41 wherein said counter means includes gate means for preventing change of the count stored therein when a blocking signal is applied thereto, said up and down signal applying means includes a fifth exclusive OR gate having an input connected to the output of said NAND gate means, first bistable latch means having a data input coupled to the output of said fifth exclusive OR gate, a clock input, a Q output, and a Q output on which said blocking signal is derived and being adapted to transfer the information on said data input to its Q output and apply the opposite logic signal to its Q output when a triggering signal is applied to said clock input, and clock signal deriving means for applying a triggering signal to said clock input of said first bistable latch means in response to both a logic 1 output from said fifth exclusive OR gate and logic 0 on said Q output of said first bistable latch means and also in response to both logic 0 output from said fifth exclusive OR gate and logic 1 on said Q output of said first bistable latch means.

50. A digital-to-analog converter in accordance with claim 49 wherein said means for applying said up and down signals also includes second bistable latch means having a data input coupled to the output of said NAND gate means, a clock input, a Q output on which said up and down signals are derived, and a Q output coupled to another input of said fifth exclusive OR gate and being adapted to transfer the information on said data input to its Q output and apply the opposite logic signal to its Q output when a triggering sign is applied to said data input, and time delay means responsive to logic 1 on said Q output of first bistable latch means for applying a triggering signal to said clock input of said second bistable latch means after a predetermined time delay and thereby reverse said up and down signals applied to said counter means and also the logic signal on said another input to said fifth exclusive OR gate.

* * * * *